(12) United States Patent
Vermeeren

(10) Patent No.: US 6,605,990 B2
(45) Date of Patent: Aug. 12, 2003

(54) BALANCED TRANSFORMER-LESS AMPLIFIER AND AN OFFSET DETECTION AND CORRECTION SYSTEM THEREFORE

(75) Inventor: Petrus Antonius Thomas Marinus Vermeeren, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/106,953

(22) Filed: Mar. 26, 2002

(65) Prior Publication Data

US 2002/0149422 A1 Oct. 17, 2002

(30) Foreign Application Priority Data

Mar. 29, 2001 (EP) .............................. 01201184

(51) Int. Cl.$^7$ ................................. H03F 1/02
(52) U.S. Cl. ......................... 330/9; 341/118
(58) Field of Search ................ 327/124, 307; 330/9, 259; 341/118

(56) References Cited

U.S. PATENT DOCUMENTS

| | | | | |
|---|---|---|---|---|
| 4,590,458 A | * | 5/1986 | Evans et al. ............. | 330/259 X |
| 4,810,973 A | * | 3/1989 | Kurz ......................... | 330/9 X |
| 4,902,981 A | * | 2/1990 | Gard et al. .................... | 330/9 |
| 4,912,423 A | * | 3/1990 | Milkovic et al. ............... | 330/9 |
| 5,053,770 A | | 10/1991 | Mayer et al. ................ | 341/118 |
| 5,272,449 A | * | 12/1993 | Izawa ............................ | 330/2 |
| 6,166,668 A | * | 12/2000 | Bautista et al. ............. | 341/118 |

FOREIGN PATENT DOCUMENTS

EP  1006650  6/2000  ............ H03G/3/34

* cited by examiner

Primary Examiner—Steven J. Mottola
(74) Attorney, Agent, or Firm—Edward W. Goodman

(57) ABSTRACT

A balanced transformer-less amplifier includes a system for detecting and correcting DC offset across the output terminals of the amplifier. The output signal is digitized, counted during a predetermined period, and the result of the counting is used to derive a DC correction signal which is fed back to the input of the amplifier.

10 Claims, 3 Drawing Sheets

BALANCED TRANSFORMER-LESS AMPLIFIER AND AN OFFSET DETECTION AND CORRECTION SYSTEM THEREFORE

BACKGROUND OF THE INVENTION

1. Field of the Invention

This invention relates to a balanced transformer-less (BTL) amplifier with output terminals for establishing a DC-connection to a load, comprising an offset detection system for detecting a differential DC-offset across the output terminals.

2. Description of the Related Art

An amplifier of the above mentioned kind is known from European Patent Application No. 1,006,650.

Presently, balanced transformer-less-amplifiers are often used, for instance, in audio systems for driving loudspeakers. Another application is in systems for driving actuators. These amplifiers have the advantage that they can generate large AC-power with a low voltage power supply and, because of the absence of output transformers or large DC-separating capacitors, they can easily be implemented in integrated circuit form. These advantages make them particularly useful as power amplifiers for use in car audio systems where they drive one or more loudspeakers.

However, the consequence of the DC-connection between the output terminals of the amplifier and the load, especially when this load has a low DC-impedance, is that large DC-currents may flow through the load if, for whatever reason, a DC-offset voltage exists between the output terminals of the amplifier. Such DC-offset voltage may e.g., be caused by a leaking DC-separation capacitor in the input of the amplifier or by an unbalance in the amplifier itself. The undesired DC-current, which may flow through the load, may be so large that the amplifier or the load (e.g., loudspeakers) is damaged or even that a serious fire-hazard occurs. In the balanced transformer-less-amplifier disclosed in the above mentioned European patent application, these problems are solved by the offset detection system, which then initializes an alarm system in case the DC-offset voltage exceeds a predetermined level. This prior art system periodically mutes the amplifier input signal, measures the DC-offset between the output terminals, and then, incase this DC-offset exceeds the predetermined level, actuates an alarm system or even shuts off the amplifier or disconnects the amplifier from the load.

SUMMARY OF THE INVENTION

An object of the present invention is to provide an amplifier of the above referenced kind which has improved functionality. To that end, the amplifier of the present invention may therefore be characterized in that said offset detection system comprises an analog-to-digital converter for converting the signal voltage across the output terminals into a digital signal, a counter integrating the digital signal during a predetermined period of time, evaluation means for evaluating the result of said counter, and a digital-to-analog converter for generating, in response to the output of the evaluation means, an analog correction signal which is applied to the input of the amplifier for counteracting the DC-offset across the output terminals.

In the amplifier of the present invention, the entire signal across the output terminals, i.e., both the DC offset and the AC signal, is measured. This entire signal is digitized and counted during a predetermined sufficiently long period, so that the result of the counting after the predetermined period is in essence only dependent on the DC offset and not on the, for the measurement undesired, AC signal. The counting result may, after digital-to-analog conversion, be applied to the input of the amplifier as a DC feedback to reduce the offset. The amplifier of the invention dynamically reduces the DC offset, so that the dissipation in the load and in the amplifier output stages is substantially reduced. This is of particular importance in battery-operated amplifiers. Another advantage of the amplifier of the present invention is that the DC-offset measurement is carried out without interrupting the normal operation of the amplifier. Moreover, the digital solution is much more robust than analog integrating systems, which must operate with very small and fragile currents in order to be able to obtain usable time-constants at a reasonable chip area.

A preferred balanced transformer-less-amplifier, according to the present invention, is characterized in that the analog-to-digital converter is a sigma-delta modulator generating a 1-bit digital representation of the signal voltage across the output terminals of the amplifier. The sigma delta modulator is a simple and straightforward analog-to-digital converter, which has the additional advantage that a 1-bit digital representation of the analog signal is obtained which can be directly supplied to the counter. The counter may, e.g., be up-counted by the one-bits and down-counted by the zero-bits of the sigma-delta modulator. However, because the counting period and the bit-rate are predetermined, a simpler counter may be used in which the one-bits only count upwards while the zero-bits have no effect.

The output of the counter may be applied to a digital-to-analog converter for generating a DC feedback signal for application to the input of the amplifier. However, the count result still comprises a measurement error caused by the incomplete cancellation of the AC component across the output terminals of.the amplifier. Apparently, the count will be higher if the predetermined period ends when the AC signal is high than if the predetermined period ends when the AC signal is low. To remove this distortion and to make the offset control system responding less instantaneously, the balanced transformer-less amplifier of the invention may be advantageously characterized in that the evaluation means is arranged to generate a first signal when the result of the counter is above a first predetermined level, and a second signal when the result of the counter is below a second predetermined level, which is lower than the first level, in that a correction counter is provided which is decremented by a predetermined number when the evaluating means generates the first signal, and which is incremented by said predetermined number when the evaluation means generates the second signal, and in that the output of the correction counter is applied to said digital-to-analog converter.

The balanced transformer-less amplifier of the present invention may also be characterized in that the evaluation means is further arranged to generate a third signal when the result of the counter is above a third predetermined level, which is higher than the first level, and a fourth signal when the result of the counter is below a fourth predetermined level, which is lower than the second level, and that alarm means is provided which is actuated when the evaluating means generates said third or fourth signal. With this measure, it is assured that when the DC offset is so large, in a positive or negative direction, that a dangerous situation, either for the amplifier or for the load or even for the environment, may be feared, an alarm is activated, which is either audible or visible or both.

In the arrangement of the invention, it may occur that a DC offset exists within the offset detection system itself, especially in the analog-to-digital converter. This is, of course, undesirable because the result would be that a DC offset across the output terminals of the amplifier is generated instead of reduced. In order to avoid this situation, the balanced transformer-less amplifier of the present invention may be further characterized in that the output terminals are connected to the analog-to-digital converter through a polarity reversing analog switch, and that the output of the analog-to-digital converter is connected to the integrating counter through a polarity reversing digital switch which runs synchronously with the polarity reversing analog switch at a rate which is an integer multiple of the rate at which the counter results are generated. In this way, any fault in the count originating from the DC-offset of the analog-to-digital converter is compensated by an equal but opposite fault in the count before the predetermined count period is finished.

Often audio systems have two amplifiers for the left and right audio signals, respectively, or four amplifiers for left and right signals and front and rear signals, respectively. In such case, each of the amplifiers should have its own offset detection means. In order to avoid too much circuitry and, consequently, too much chip area when the amplifiers are integrated on a single monolithic chip, it is a further object of the invention to provide a plurality of balanced transformer-less amplifiers which is characterized in that one or more parts of the offset detection system are multiplexed to operate successively for the offset detection and correction of each of said amplifiers.

The invention relates also to an offset detection and correction system for use in a balanced transformer-less amplifier according to the invention. It may be observed, that the offset detection and correction system and the balanced transformer-less amplifier, when they are implemented in separate integrated circuits, may be easily interconnected because the amplifier-terminals, to which the offset detection and correction system has to be connected, i.e., the two output terminals and the input terminal, are usually accessible.

BRIEF DESCRIPTION OF THE DRAWINGS

The invention will be further explained with reference to the attached drawings, in which.

DESCRIPTION OF THE PREFERRED EMBODIMENTS

Figure 1:
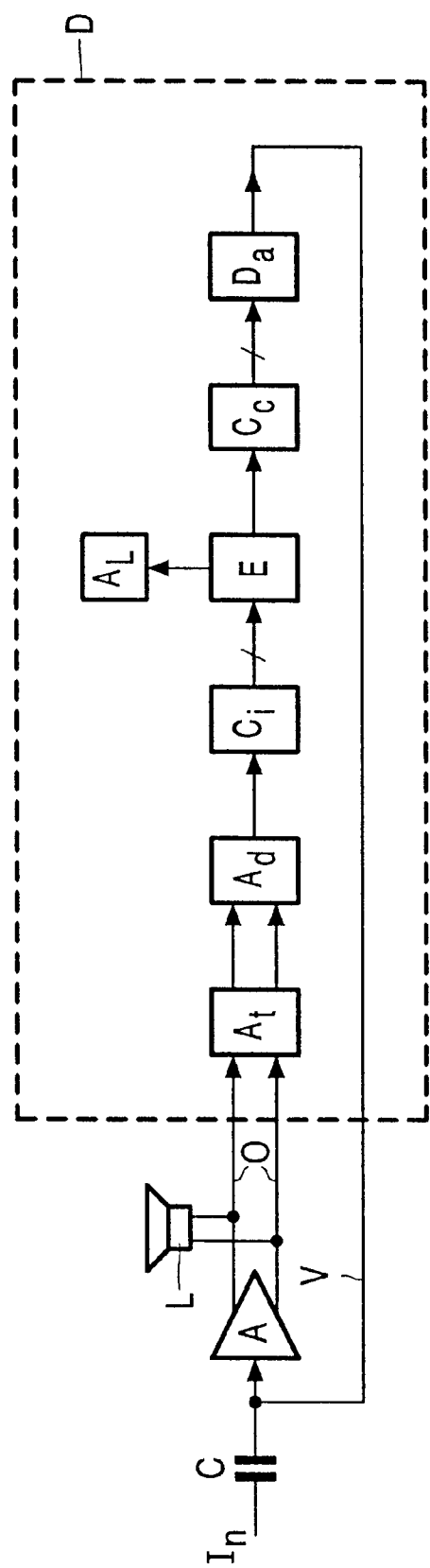
FIG. 1 is a block schematic diagram of a first embodiment of a balanced transformer-less amplifier with an offset detection system according to the invention.

FIG. 1 shows a balanced transformer-less amplifier A to which an input signal may be applied through an input terminal $I_n$ and a DC separation capacitor C. Output terminals O of the amplifier are directly connected to a load L, which may, e.g., be constituted by a loudspeaker. Due to leakage of the capacitor C or due to a not perfectly balanced amplifier A, an undesired DC offset may exist between the two output terminals, and this DC offset may cause a relatively large.DC current to flow through the load L, which usually has a low impedance for direct current. This relatively large DC current causes extra dissipation in the load L and in the amplifier A, reduces the linear range of the amplifier so that signal distortions at large signal levels easily occur, and may even cause damages of the amplifier and/or of the load.

In order to correct the DC offset, the amplifier comprises DC offset detection and correction means D. This means measures the entire voltage (AC and DC) between the two output terminals, detects the DC offset contained therein, and finally applies the result of this detection to the input of the amplifier in order to correct, or at least substantially reduce, the DC-offset. The means D comprises an attenuator $A_t$ to which the output signal of the amplifier is applied, and the attenuated signal is subsequently applied to an analog-to-digital converter $A_d$. The attenuator $A_t$ serves to adapt the level of the output signal to the range of operation of the analog-to-digital converter $A_d$. The digital output of the analog-to-digital converter $A_d$ is subsequently counted during a predetermined counting period $T_c$ in an integration counter $C_i$. The analog-to-digital converter $A_d$ is in the form of a synchronous sigma delta modulator which generates a 1-bit bitstream. This kind of analog-to-digital converter is preferred because the bits of the bitstream can be directly applied to the counter $C_i$. In this bitstream, the density of the one-bits is proportional to the input signal so that when the input signal is maximally negative, the sigma delta modulator generates exclusively zero-bits, and when the input signal is maximally positive, the sigma delta modulator generates exclusively one-bits. When the input signal is zero, the modulator produces equal numbers of one-bits and zero-bits. The sigma delta modulator may conveniently produce, e.g., 625 kbits per second and the counting period $T_c$ may be chosen equal to $T_c=2^{17}/625000$ s=209.7152 ms. In this case the output of the counter is a digital number ranging from 0 to $2^{17}$ while the mid-value, which occurs when the input signal is zero during the entire counting period, is equal to $2^{16}$=65536.

The DC offset detection and correction means D further comprises evaluation means E, wherein the number outputted by the counter $C_i$ is evaluated, and which, in turn, controls an 8-bit correction counter $C_c$. The output number of the correction counter $C_c$ is, after conversion in a digital-to-analog converter $D_a$, applied, through a connection V, to the input of the amplifier A for correcting the DC offset of this amplifier.

In operation, when the output number of the integrating counter $C_i$ is above a first threshold, which lies somewhat above the mid-value of 65536, the evaluation means E sends a down-command to the correction counter $C_c$. This down-command decreases the value of the correction counter by, e.g., 1 so that, after the D/A conversion, the DC level at the input of the amplifier A, and thus the DC offset at its output terminals, is reduced by one step. When, during the next counting period $T_c$, the output of the counter $C_i$ is still above said first threshold, another down-command is send by the evaluation means E to the correction counter $C_c$ and the DC offset is again reduced by one step, and so on until the integrating counter $C_i$ output is below the first threshold.

On the other hand, when the output number of the integrating counter $C_i$ is below a second threshold which is somewhat below the mid-value of 65536, the evaluation means E generate an up-command for the correction counter $C_c$ and the DC level at the input of the amplifier is increased by one step. It will be appreciated that when the counter output number is between the first and second thresholds, the counter output number is close to its mid-value and the DC offset is zero, or so low that no correction is required.

Additionally, when the output number of the integration counter $C_i$ is above a third threshold which is substantially higher than the first threshold, or when the output number is below a fourth threshold which is substantially lower than the second threshold, this means that, at the amplifier output, a sufficiently large positive or negative DC offset exists that a dangerous situation may arise. In these cases, the evaluation means E sends an alarm signal to alarm means $A_L$ which then may give a visible or audible alarm and/or may switch off the amplifier from its power supply so that any damage of the amplifier or its load is avoided.

Figure 2:
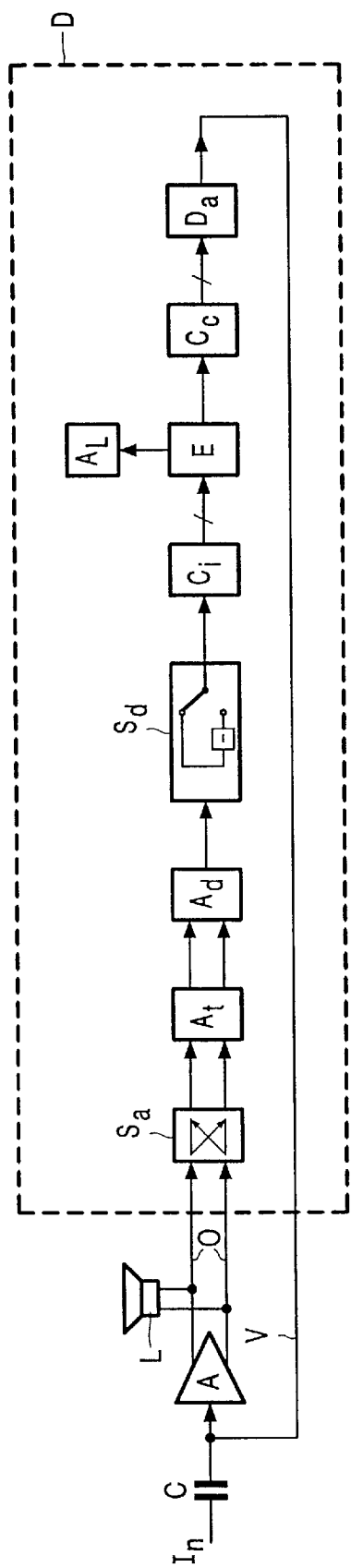
FIG. 2 is a block schematic diagram of a second embodiment of a balanced transformer-less amplifier with an offset detection system according to the invention.

A modification of the arrangement of FIG. 1 is shown in FIG. 2 in which corresponding elements have the same references. A problem with the arrangement of FIG. 1 is that the analog part of the offset detection and correction system, i.e., the attenuator $A_t$ and the analog-to-digital converter $A_d$, are themselves not free from DC offset (herein called, system-offset). The offset detection and correction system will try to cancel the entire DC offset and, consequently, it will create an offset at the output terminals O which counteracts the system-offset. To remove this effect, the arrangement of FIG. 2 comprises a polarity reversing analog switch $S_a$ before the attenuator $A_t$ and a polarity reversing digital switch $S_d$ after the analog-to-digital converter $A_d$. The switches $S_a$ and $S_d$ run synchronously with a duty cycle of 50% and at a rate which is an integer times the rate at which the count results are generated. In other words: an integer number of switch cycles (e.g., 4) fit within the predetermined counting period $T_c$ and the switches are held equally long in one position as in the other position. The result is that any excess number of one-bits generated by the analog-to-digital converter due to the system-offset, is followed by an equal excess number of zero-bits due to this offset during the same counting period. Therefore, the output number of the counter $C_i$ is no longer affected by the system-offset. It should be noted that when the analog-to-digital converter generates a 1-bit bitstream, as is the case with a sigma delta modulator, the polarity reversing digital switch $S_d$ may be formed by a simple EXclusiveOR-gate (EXOR-gate).

Figure 3:
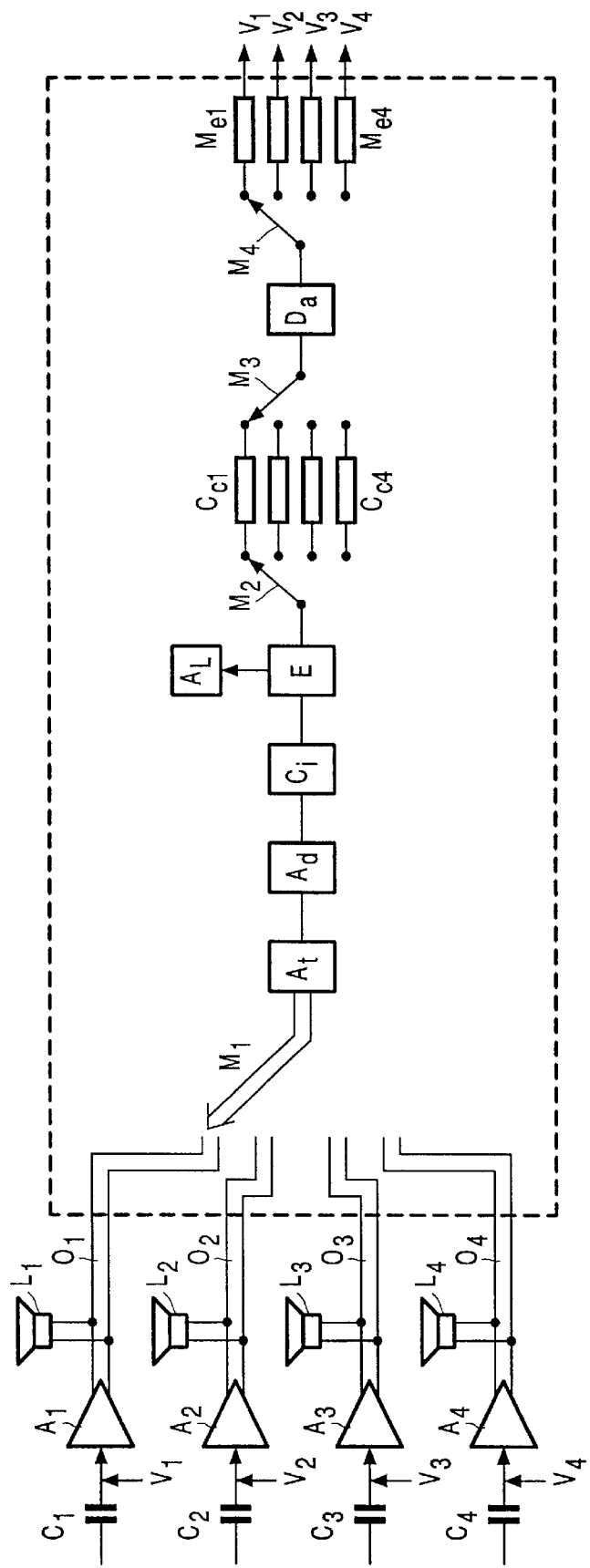
FIG. 3 is a block schematic diagram of a plurality of balanced transformer-less amplifiers with an offset detection system according to the invention.

The arrangement of FIG. 3 comprises four BTL amplifiers $A_1$ to $A_4$, each with an input capacitance $C_1$ to $C_4$ and it's a load L, to $L_4$. For detecting and correcting the DC offset, it would be possible to provide each amplifier with its own DC offset detecting and correction system. However, in order to save chip area, the four amplifiers utilize, in succession, the same attenuator $A_t$, analog-to-digital converter A, integration counter $C_i$ and evaluation means E. To this end, the output terminals $O_1$ to $O_4$ of the four amplifiers $A_1$ to $A_4$ are connected to the attenuator $A_t$ by an analog multiplexing switch $M_1$, and the output of the evaluation means E is connected to four correction counters $C_{c1}$ to $C_{c4}$ through a digital de-multiplexing switch $M_2$. The multiplexing/demultiplexing switches $M_1$ and $M_2$ run synchronously to connect the units $A_t$, $A_d$, $C_i$ and E firstly between the output terminals $O_1$ and the input of $C_{c1}$, then between the output terminals $O_2$ and the input of $C_{c2}$ and so on. Therefore, the units $A_t$, $A_d$, $C_i$ and E operate in succession for each of the amplifiers to increment or decrement their respective:correction counter. Preferably, the multiplexing rate is chosen so that the units $A_t$, $A_d$, $C_i$ and E operate for one amplifier during one single counting period $T_c$.

Additionally, also the D/A converter $D_a$ is used in common for the offset correction of each of the four amplifiers by means of a digital multiplexing switch $M_3$ between the correction counters $C_{c1}$ to $C_{c4}$ and the input of the D/A converter and a synchronously running analog de-multiplexing switch $M_4$ between the output of the DA converter and four current memories $M_{e1}$ to $M_{e4}$. These current memories supply the calculated quantized DC current through the leads $V_1$ to $V_4$ to each of the inputs of the amplifiers $A_1$ to $A_4$ in order to correct for their respective offsets. The current memories are necessary in order to maintain the DC levels when the DA converter is operative for one of the other amplifiers. An implementation of the current memories may be found in Section 6.8 of the book *"Integrated Analog to Digital and Digital to Analog Converters"* by R. van de Plassche, ISBN 0-7923-9436-4.

It should be noted that the units $A_t$, $A_d$, $C_i$ and E may be multiplexed without the digital-to-analog converter being multiplexed and that the digital-to-analog converter may be multiplexed without the units $A_t$, $A_d$, $C_i$ and E being multiplexed. It is also noted that the multiplexing/de-multiplexing switches $M_3$ and $M_4$ need not necessarily run synchronously with the multiplexing/de-multiplexing switches $M_1$ and $M_2$. It will be apparent that the multiplexing functions, as explained with reference to FIG. 3, and the zeroing of the system-offset which is depicted in FIG. 2, may be used in combination. In that case, the functions of the polarity switch $S_a$ of FIG. 2 and the multiplex switch $M_1$ of FIG. 3 may conveniently be combined.

What is claimed is:

1. A balanced transformer-less amplifier with output terminals for establishing a DC-connection to a load, said balanced transformed-less amplifier comprising an offset detection system for detecting a differential DC-offset across the output terminals, characterized in that said offset detection system comprises:

an analog-to-digital converter for converting a signal voltage across the output terminals into a digital signal;

a counter coupled to the analog-to-digital converter for intergrating the digital signal during a predetermined period of time, said counter forming a counting result;

evaluation means coupled to the counter for evaluating the counting result of said counter; and a digital-to-analog converter coupled to an output of the evaluation means for generating analog correction signal, said analog correction signal being applied to an input of the amplifier for counteracting the DC-offset across the output terminals, characterized in that the analog-to-digital converter is a sigma-delta modular generating a 1-bit digital representation of the signal voltage across the output terminals of the amplifier.

2. A balanced transformer-less amplifier with output terminals for establishing a DC-connection to a load, said balanced transformer-less amplifier comprising an offset detection system of detecting a differential DC-offset across the output terminals, characterized in that said offset detection system comprises:

an analog-to-digital converter for converting a signal voltage across the output terminals into a digital signal;

a counter coupled to the analog-to-digital converter for intergrating the digital signal during a predetermined period of evaluation means coupled to the counter for evaluation the counting result of said counter; and time, said counter forming a counting result;

a digital-to-analog converter coupled to an output of the evaluation means for generating an analog correction signal, said analog correction signal being applied to an input of the amplifier for counteracting the DC-offset across the output terminals, characterized in that the evaluation means generates a first signal when the counting result of the counter is above a first predetermined level, and a second signal when the counting result of the counter is below a second predetermined level, said second predetermined level being lower than the first predetermined level, and in that said offset detection system further comprimises a correction counter, said correction counter being decremented by a predetermined number when the evaluating means generates the first signal, and being incremented by said predetermined number when the evaluation means generates the second signal, an output of the correction counter being applied to said digital-to-analog converter.

3. The balanced transformer-less amplifier as claimed in claim 2, characterized in that the evaluation means further generates a third signal when the counting result of the counter is above a third predetermined level, said third predetermined level being higher than the first predetermined level, and a fourth signal when the counting result of the counter is below a fourth predetermined level, said fourth predetermined level being lower than the second predetermined level, and in that said offset detection system further comprises alarm means, said alarm means being actuated by the evaluating means when the evaluating means generates said third or fourth signal.

4. A balanced transformer-less amplifier with output terminals for establishing a DC-connection to a load, said balanced transformer-less amplifier comprising of an offset detection system for detecting a differential DC-offset across the output terminals, characterized in that said offset detection system comprises:

an analog-to-digital converter for converting a signal voltage across the output terminals into a digital signal;

a counter coupled to the analog-to-digital converter for intergrating the digital signal during a predetermined period of time, said counter forming a counting result;

evaluation means coupled to the counter for evaluating the counting result of said counter; and a digital-to-analog converter coupled to an output of the evaluating means for generating an analog correction signal, said analog correction signal being applied to an input of the amplifier for counteracting the DC-offset across the output terminals, characterized in that the offset detection system further comprises:

a polarity reversing switch for connecting the output terminals to the analog-to-digital converter; and a polarity reversing digital switch for connecting the output of the analog-to-digital converter to the intergrating counter, said polarity reversing digital switch operating synchronously with the polarity reversing analog switch at a rate being an interger multiple of a rate at which the counting results are generated by the counter.

5. A plurality of balanced transformer-less amplifiers with an offset detection system comprises:

an analog-to-digital converter for converting a signal voltage across output terminals of at least one of the plurality of balanced transformer-less amplifiers into a digital signal;

a counter coupled to the analog-to-digital converter for integrating the digital signal during a predetermined period of time, said counter forming a counting result;

evaluation means coupled to the counter for evaluating the counting result of said counter; and a digital-to-analog converter coupled to an output of the evaluation means for generating an analog correction signal, said analog correction signal being applied to an input of the amplifier for counteracting the DC-offset across the output terminals, characterized in that one or more parts of the offset detection system are multiplexed to operate successively for the offset detection and correction of each of said plurality of balanced transformer-less amplifiers.

6. An offset detection and correction system for use in a balanced transformer-less amplifier as claimed in claim 1.

7. An offset detection and correction system for use in a balanced transformer-less amplifier as claimed in claim 2.

8. An offset detection and correction system for use in a balanced transformer-less amplifier as claimed in claim 3.

9. An offset detection and correction system for use in a balanced transformer-less amplifier as claimed in claim 4.

10. An offset detection and correction system for use in a balanced transformer-less amplifier as claimed in claim 5.

* * * * *

UNITED STATES PATENT AND TRADEMARK OFFICE
CERTIFICATE OF CORRECTION

PATENT NO. : 6,605,990 B2
DATED : August 12, 2003
INVENTOR(S) : Petrus A.T.M. Vermeeren It is certified that error appears in the above-identified patent and that said Letters Patent is hereby corrected as shown below:

<u>Column 6,</u>
Line 59, after "period of" insert -- time, said counter forming a counting result; --;
Line 62, delete "time, said";
Line 63, delete in its entirety.

Signed and Sealed this

Thirty-first Day of May, 2005

JON W. DUDAS
*Director of the United States Patent and Trademark Office*